US008860094B2

(12) United States Patent
Yasumori et al.

(10) Patent No.: US 8,860,094 B2
(45) Date of Patent: Oct. 14, 2014

(54) SEMICONDUCTOR DEVICE WITH POWER SUPPLY LINE SYSTEM OF REDUCED RESISTANCE

(75) Inventors: Koji Yasumori, Tokyo (JP); Hisayuki Nagamine, Tokyo (JP); Yuki Miura, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 386 days.

(21) Appl. No.: 13/426,013

(22) Filed: Mar. 21, 2012

(65) Prior Publication Data

US 2012/0247812 A1 Oct. 4, 2012

(30) Foreign Application Priority Data

Mar. 29, 2011 (JP) ................. 2011-071523

(51) Int. Cl.
*H01L 23/528* (2006.01)
*H01L 27/02* (2006.01)
*H01L 27/118* (2006.01)

(52) U.S. Cl.
CPC ......... *H01L 27/0207* (2013.01); *H01L 27/0248* (2013.01); *H01L 27/11803* (2013.01); *H01L 27/11898* (2013.01); *H01L 2027/11885* (2013.01); *H01L 2027/11887* (2013.01); *H01L 2924/0002* (2013.01); *H01L 23/5286* (2013.01)
USPC ....................................... 257/207

(58) Field of Classification Search
USPC ........................................... 257/207
See application file for complete search history.

(56) References Cited

U.S. PATENT DOCUMENTS 8,362,614 B2 * 1/2013 Katagiri et al. ............... 257/738

FOREIGN PATENT DOCUMENTS

JP 10-41393 A 2/1998

* cited by examiner

*Primary Examiner* — Evan Pert
(74) *Attorney, Agent, or Firm* — Foley & Lardner LLP

(57) ABSTRACT

A semiconductor device with a power wiring system. The device includes a multi-level wiring structure including a lower-level wiring layer and an upper-level wiring layer over the lower-level wiring layer, and the power wiring system includes a first power supply line and a second power supply line provided as the first-level wiring layer and extending in a first direction in substantially parallel to each other, a third power supply line provided as the upper-level wiring layer and extending in the first direction with overlapping the first power supply line, the first and third power supply lines conveying first and second power voltages, respectively, which are different from each other, and a fourth power supply line provided as the upper-level wiring layer and extending in the first direction with overlapping the second power supply line, the second and fourth power supply lines conveying the second and first power voltages, respectively.

19 Claims, 16 Drawing Sheets

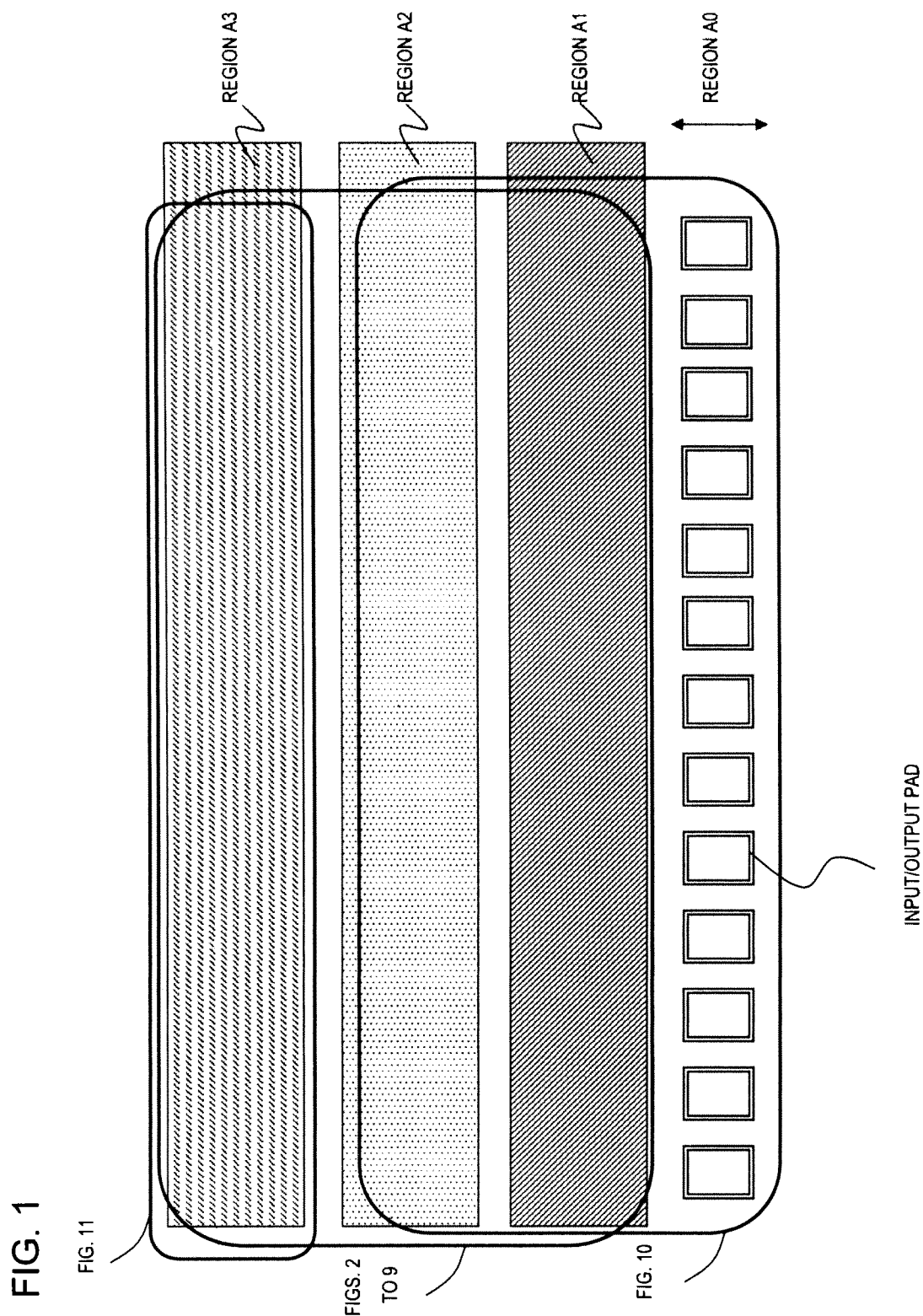

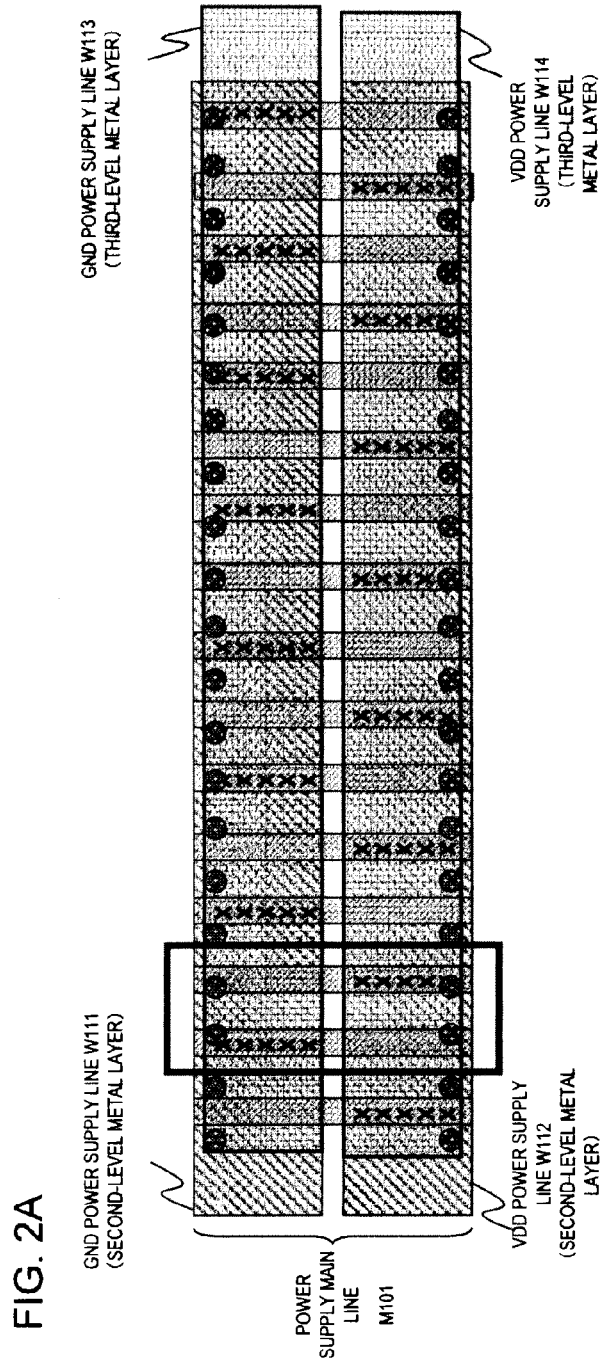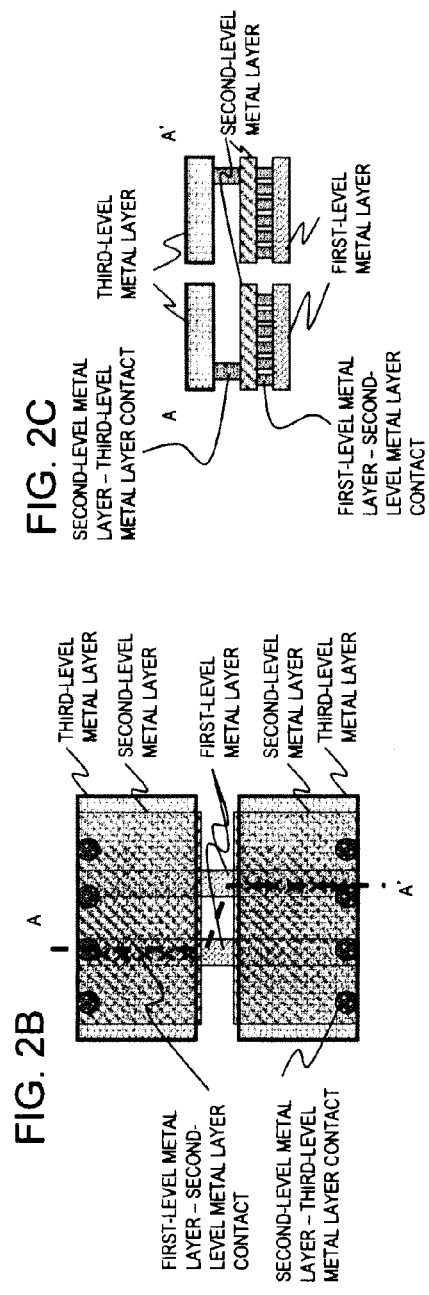

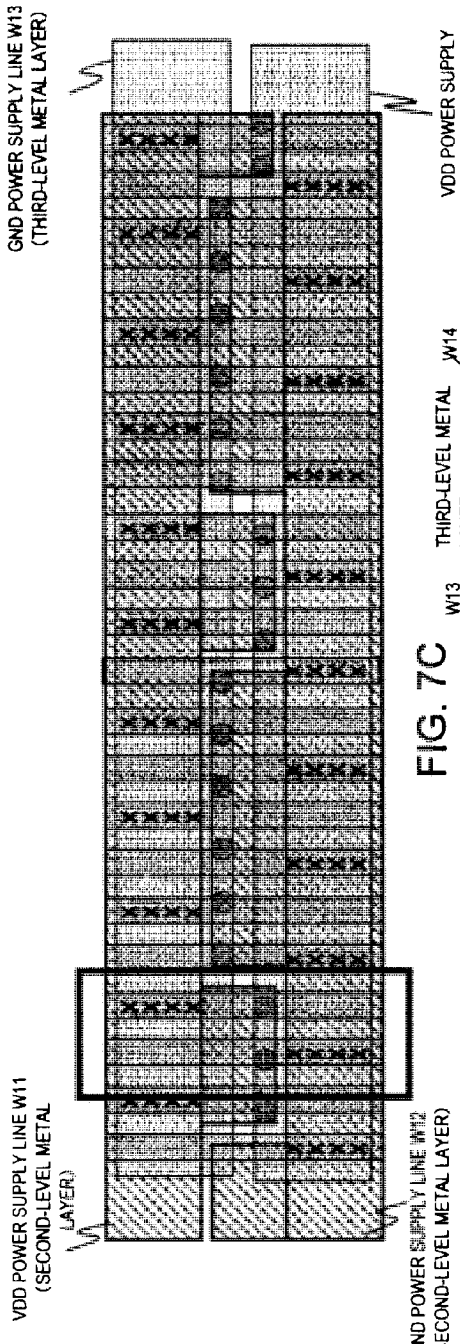
FIG. 7A
VDD POWER SUPPLY LINE W11 (SECOND-LEVEL METAL LAYER)
GND POWER SUPPLY LINE W12 (SECOND-LEVEL METAL LAYER)
GND POWER SUPPLY LINE W13 (THIRD-LEVEL METAL LAYER)
VDD POWER SUPPLY LINE W14 (THIRD-LEVEL METAL LAYER)
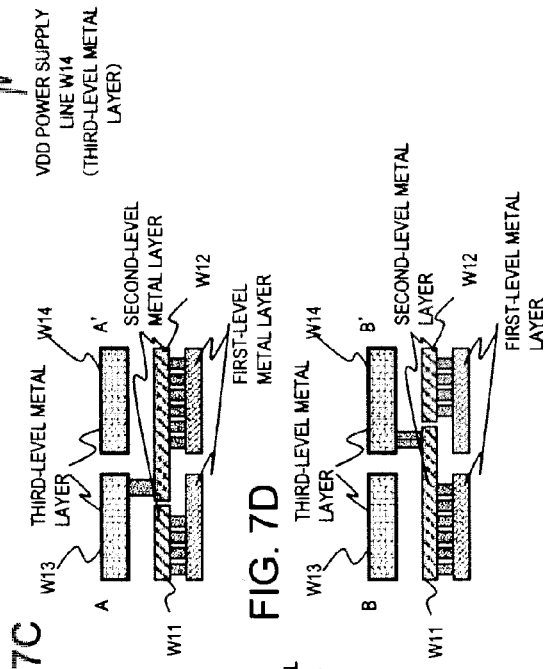
FIG. 7C
FIG. 7D
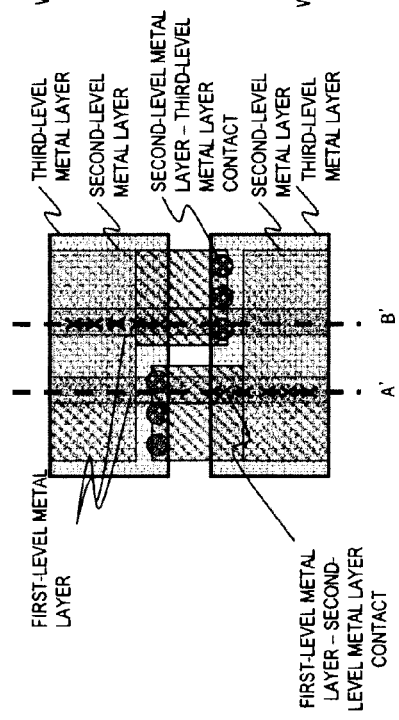
FIG. 7B

US 8,860,094 B2

SEMICONDUCTOR DEVICE WITH POWER SUPPLY LINE SYSTEM OF REDUCED RESISTANCE

REFERENCE TO RELATED APPLICATION

This application is based upon and claims the benefit of priority of Japanese patent application No. 2011-071523, filed on Mar. 29, 2011, the disclosure of which is incorporated herein in its entirety by reference thereto.

TECHNICAL FIELD

The present invention relates to a semiconductor device, and in particular to a semiconductor device having a multi-level wiring structure.

BACKGROUND

Recent demands for low power consumption, large integration density and high speed in semiconductor integrated circuit devices (chips) have required remarkable reduction in power supply resistance or significantly lowering resistance of power supply lines.

Moreover, standard cell methodology is widely employed in chip designing. Japanese Patent Kokai Publication No. JP-H10-041393A, which is incorporated herein by reference thereto, describes, as a power supply system for a standard cell, a power supply line formed along the cell rack (cell array) and a power supply bridge line arranged perpendicular to the power supply line.

The inventors of the present disclosure have carefully analyzed the power supply line system to further reduce the resistance thereof and have thus discovered the following problems, which will be described with reference to FIGS. 1 to 5 indicative of a prototype power supply line system conceived by the inventors.

FIG. 1 is a diagram illustrating a definition of regions A0 to A3 that appear in the following description. The regions A0 to A3 are defined as shown in FIG. 1, in a layout diagram of a semiconductor integrated circuit device. Here, the region A0 is a region in which input/output PADs are disposed, and this region is a power supply source. The region A1 is a region in which a power supply protection device, an input/output protection device, or an output transistor is disposed, as a measure against ESD (Electrostatic Discharge) or latch-up. An output transistor or a circuit device controlling the transistor is disposed in the region A2. The region A3 is a region in which a logic circuit, which operates by a power supply different from the region A1 and the region A2, is disposed. FIG. 2A to FIG. 11 below respectively illustrate regions enclosed by solid lines in FIG. 1.

FIGS. 2A to 2C are diagrams showing a layout of prototype power supply lines, which employs a multi-level wiring structure including a first-level wiring (metal) layer, a second-level wiring (metal) layer formed over the first-level metal layer with an intervention of a first interlayer insulating film therebetween, and a third-level wiring (metal) layer formed over the second-level metal layer with an intervention of a second interlayer insulating film therebetween. Referring to FIG. 2A, as a second-level metal layer above a cell rack (cell array) (not shown in the diagram), a pair of power supply lines formed of a GND power supply line W111 and a VDD power supply line W112 are arranged along the cell rack. Furthermore, as a third-level metal layer, a pair of power supply lines formed of a GND power supply line W113 and a VDD power supply line W114 are arranged. Here, the GND power supply line W113 is arranged above the GND power supply line W111. Meanwhile, the VDD power supply line W114 is arranged above the VDD power supply line W112.

FIG. 2B is an enlarged layout diagram of a region enclosed by a solid line in FIG. 2A. FIG. 2C is a cross-sectional diagram along a path A-A' of FIG. 2B. In FIG. 2A and FIG. 2B, "X" indicates contacts between the first-level metal layer and the second-level metal layer, and filled circles indicate contacts between the second-level metal layer and the third-level metal layer. By having regular contacts between the second-level metal layer and the third-level metal layer, the GND power supply line W111 and the GND power supply line W113 are connected, and also the VDD power supply line W112 and the VDD power supply line W114 are connected, and wiring resistance of these power supply lines is reduced.

In a configuration shown in FIGS. 2A to 2C, a GND power supply line W111 provided as a second-level metal layer and a GND power supply line W113 provided as a third-level metal layer convey the same ground voltage. Furthermore, a VDD power supply line W112 provided as the second-level metal layer and a VDD power supply line W114 provided as the third-level metal layer convey the same power source voltage. In this case, a problem occurs when power supply main lines are interconnected. A description is given below concerning this problem, making reference to FIG. 3 to FIG. 5.

FIG. 3 illustrates a layout in a case where a power supply main line M101 and a power supply main line M102 are connected by a first-level metal layer. Referring to FIG. 3, the power supply main line M101 has the GND power supply lines W111 and W113, and the VDD power supply lines W112 and W114, and has a configuration similar to FIGS. 2A to 2C. Similarly, the power supply main line M102 has VDD power supply lines W121 and W123, and GND power supply lines W122 and W124, and has a configuration similar to FIGS. 2A to 2C.

In the configuration of FIG. 3, in a case where a VDD power supply line included in the power supply main line M101 and a VDD power supply line included in the power supply main line M102 are connected via the first-level metal layer, as shown in FIG. 3, the VDD power supply line W123 and the VDD power supply line W114 are connected via wiring W131 provided as the first-level metal layer. "X" in FIG. 3 illustrates contacts connecting the VDD power supply line W123 and the wiring W131, and contacts connecting the VDD power supply line W114 and the wiring W131. In this case, a circuit (cell) cannot be disposed in two regions B1 and B2 that are enclosed by sold lines in FIG. 3.

Meanwhile, FIG. 4 illustrates another layout in a case where the power supply main line M101 and the power supply main line M102 are connected by the first-level metal layer. Referring to FIG. 4, the power supply main line M101 includes the GND power supply lines W111 and W113, and the VDD power supply lines W112 and W114, and has a configuration similar to FIGS. 2A to 2C. Similarly, the power supply main line M102 includes the VDD power supply lines W121 and W123, and the GND power supply lines W122 and W124, and has a configuration similar to FIGS. 2A to 2C.

In the configuration of FIG. 4, in a case where a VDD power supply line included in the power supply main line M101 and a VDD power supply line included in the power supply main line M102 are connected via the first-level metal layer, as shown in FIG. 4, the VDD power supply line W123 and the VDD power supply line W114 are connected via wiring W132 provided as the first-level metal layer. "X" in FIG. 4 illustrates contacts connecting the VDD power supply line W123 and the wiring W132, and contacts connecting the VDD power supply line W114 and the wiring W132. In this case also, similar to the case shown in FIG. 3, a circuit (cell) cannot be disposed in two regions C1 and C2 that are enclosed by sold lines in FIG. 4. In addition, a problem occurs in that wiring resistance increases with the distance the wiring W132 extends as shown in FIG. 4.

FIG. 5 illustrates a layout in a case where the power supply main line M101 and the power supply main line M102 are connected by a second-level metal layer. Referring to FIG. 5, the power supply main line M101 includes the GND power supply lines W111 and W113, and the VDD power supply lines W112 and W114, and has a configuration similar to FIGS. 2A to 2C. Similarly, the power supply main line M102 includes the VDD power supply lines W121 and W123, and the GND power supply lines W122 and W124, and has a configuration similar to FIGS. 2A to 2C.

In the configuration of FIG. 5, in a case where a VDD power supply line included in the power supply main line M101 and a VDD power supply line included in the power supply main line M102 are connected via the second-level metal layer, as shown in FIG. 5, the VDD power supply line W123 and the VDD power supply line W114 are connected via wiring W133 provided as the second-level metal layer. In this case, there is a problem in that, in four regions D1 to D4 enclosed by solid lines, the GND power supply line W111 and the GND power supply line W122 provided as the second-level metal layer are not connected, and resistance increases.

SUMMARY

In one embodiment, there is provided a semiconductor device that comprises a multi-level wiring structure including a lower-level wiring layer and an upper-level wiring layer over the lower-level wiring layer; a first power supply line and a second power supply line provided as the first-level wiring layer and extending in a first direction in substantially parallel to each other; a third power supply line provided as the upper-level wiring layer and extending in the first direction with overlapping the first power supply line, the first and third power supply lines conveying first and second power voltages, respectively, which are different from each other; and a fourth power supply line provided as the upper-level wiring layer and extending in the first direction with overlapping the second power supply line, the second and fourth power supply lines conveying the second and first power voltages, respectively.

In another embodiment, such a semiconductor device is derived that comprises a first-level wiring layer, a second-level wiring layer formed over the first-level wiring layer with an intervention of a first interlayer insulating film therebetween, and a third-level wiring layer formed over the second-level wiring layer with an intervention of a second interlayer insulating film therebetween; a cell formation region elongated in a first direction and including a plurality of gate cells, each of the gate cells including first and second power lines each formed as the first-level wiring layer and arranged a second direction crossing the first direction; a third power line formed as the second-level wiring layer and elongated in the first direction to cross each of the first and second power lines of each of the gates cells; a plurality of first contacts each formed in the first interlayer insulating film to connect the first power line of each of the gate cells to the third power line; a fourth power line formed as the second-level wiring layer and elongated in the first direction to cross each of the first and second power lines of each of the gates cells; a plurality of second contacts each formed in the first interlayer insulating film to connect the second power line of each of the gate cells to the fourth power line; a fifth power line formed as the third-level wiring layer and elongated in the first direction with overlapping the third power line; a sixth power line formed as the third-level wiring layer and elongated in the first direction with overlapping the fourth power line; a plurality of third contacts each formed in the second interlayer insulating film to connect the fourth and fifth power lines to each other; and a plurality of fourth contacts each formed in the second interlayer insulating film to connect the third and fourth power lines to each other In still another embodiment, there is provided a semiconductor device comprising: a multi-level wiring structure comprising a lower-level wiring layer, an interlayer insulating film covering the lower-level wiring layer and an upper-level wiring layer formed over the interlayer insulating film; a first power line formed as the lower-level wiring layer and elongated in a first direction; a second power line formed as the lower-level wiring layer and elongated in the first direction; a third power line formed as the lower-level wiring layer and elongated in the first direction, the second power line being sandwiched between the first and third power lines; a fourth power line formed as the lower-level wiring layer and elongated in the first direction, the third power line being sandwiched between the second and fourth power lines; a first connection line formed as the lower-level wiring layer to connect the second and third power lines to each other; a fifth power line formed as the upper-level wiring layer and elongated in the first direction with overlapping the first power line, the fifth power line being electrically connected to the second power line; a sixth power line formed as the upper-level wiring layer and elongated in the first direction with overlapping the second power line, the sixth power line being electrically connected to the first power line; a seventh power line formed as the upper-level wiring layer and elongated in the first direction with overlapping the third power line, the seventh power line being electrically connected to the fourth power line; an eighth power line formed as the upper-level wiring layer and elongated in the first direction with overlapping the fourth power line, the eighth power line being electrically connected to the third power line; and a second connection line formed as the upper-level wiring layer to connect sixth and seventh power lines to each other.

BRIEF DESCRIPTION OF THE DRAWINGS

FIGS. 1 to 5 are plan views and/or cross sectional views illustrating respective parts of a power supply line system of a prototype device conceived by the present inventors;

FIGS. 7A to 7D are layout diagrams illustrating a configuration of a semiconductor device according to an exemplary embodiment;

EMBODIMENTS

Figure 3:
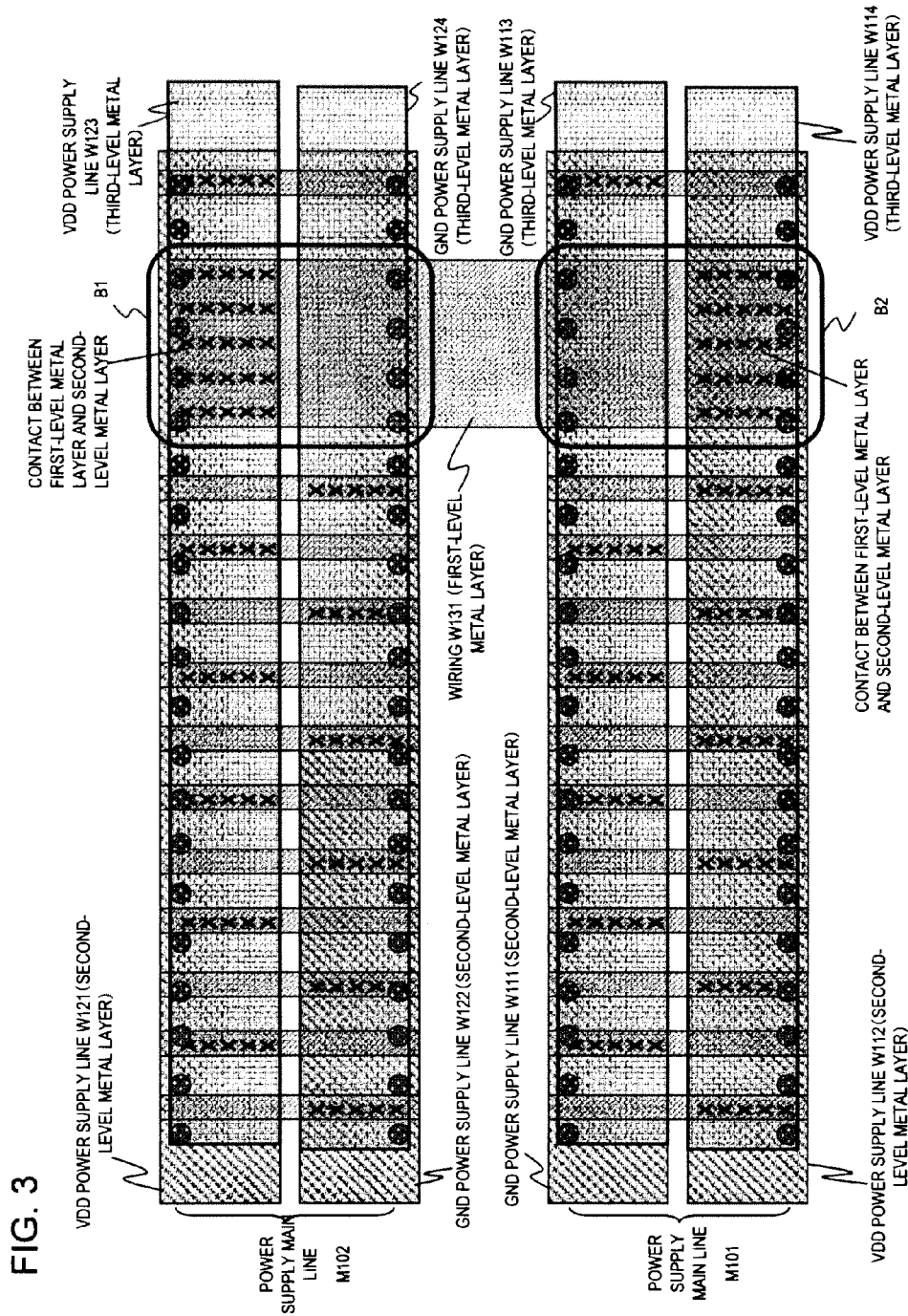

Detailed descriptions will be made hereinafter on various embodiments, but it is apparent that the present invention is not restricted thereto. It should be also noted that reference symbols in the drawings attached to this disclosure are shown solely by way of example in order to assist understanding, and are not intended to limit the present disclosure to modes shown in the drawings.

Figure 6:
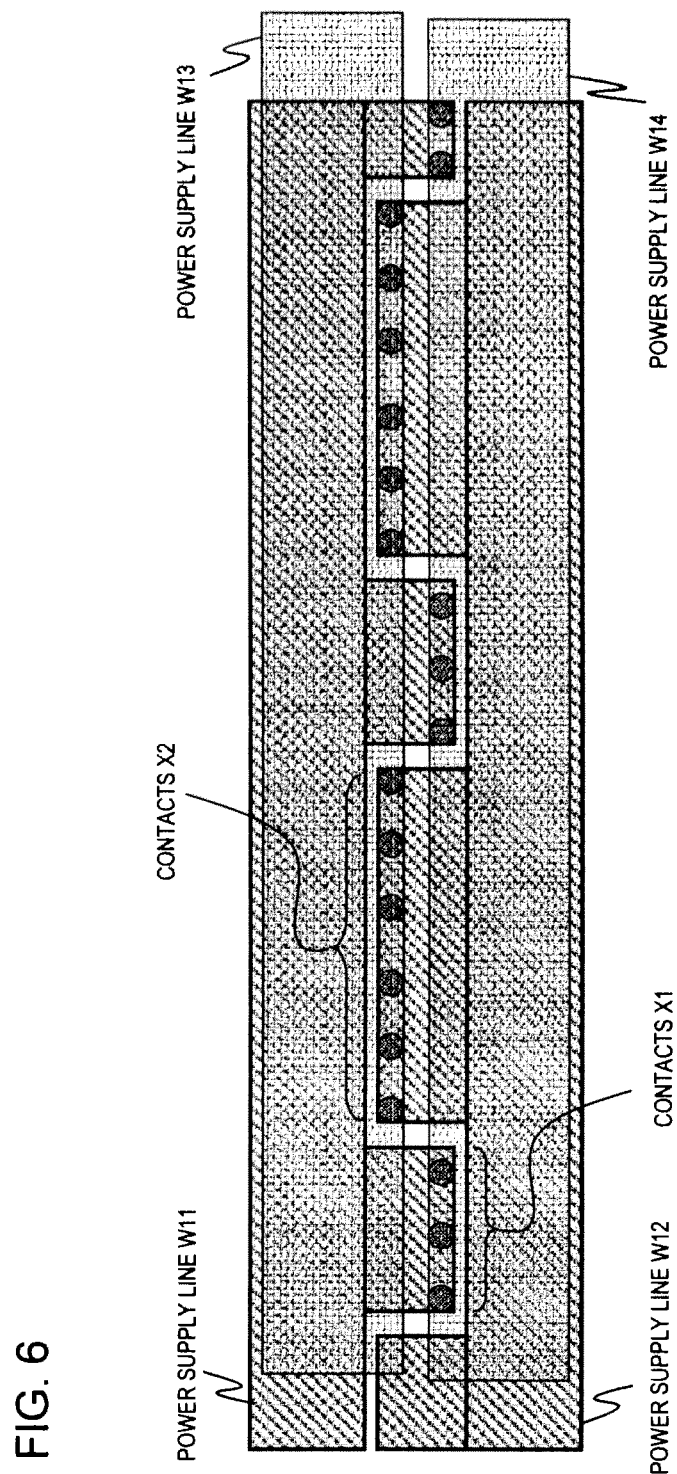
FIG. 6 is a layout diagram schematically illustrating a configuration of a semiconductor device according to an exemplary embodiment.

Referring now to FIG. 6, a semiconductor device shown therein is formed with a multi-level wiring structure including a lower-level wiring layer and an upper-level wiring layer over the lower-level wiring layer. This device includes a first power supply line (W11) and a second power supply line (W12) provided as the lower-level wiring layer and extending in a first direction in substantially parallel to each other. A third power supply line (W13) is provided as the upper-level wiring layer and extends in the first direction with overlapping the first power supply line (W11). The first and third power supply lines (W11, W13) convey first and second power voltages, respectively, which are different from each other. A fourth power supply line (W14) is provided as the upper-level wiring layer and extends in the first direction with overlapping the second power supply line (W12), and the second and fourth power supply lines (W12, W14) conveying the second and first power voltages, respectively.

The first and third power supply lines (W11, W13) may convey a power source voltage (VDD) and a ground voltage (GND), respectively; and the second and fourth power supply lines (W12, W14) may convey GND and VDD, respectively.

Furthermore, the semiconductor device is preferably further provided with a first contact (X1) connecting the first power supply line (W11) and the fourth power supply line (W14). The contact X1 may be made of vias that are provided in an interlayer insulating layer between the lower-level and upper-level wiring layers, and a second contact (X2) connecting the second power supply line (W12) and the third power supply line (W13). The contact X2 may be also made of vias that are provided in the interlayer insulating layer.

Furthermore, referring to FIG. 6, the first power supply line (W11) may comprise a convex part projecting towards the second power supply line (W12) and connected to the fourth power supply line (W14) via a first contact (X1). Furthermore, the second power supply line (W12) may comprise a convex part projecting towards the first power supply line (W11) and connected to the third power supply line (W13) via a second contact (X2).

According to this semiconductor device, as will be more apparent from the following descriptions, it is possible to reduce wiring resistance by interconnecting power supply lines within a power supply main line, and also to further reduce wiring resistance by connecting power supply lines between power supply main lines.

Turning to FIGS. 7A to 7D, there shown detailed layouts illustrating a semiconductor device according to an embodiment. Referring first to FIG. 7A, as is discussed with reference to FIG. 6, a pair of power supply lines formed of a VDD power supply line W11 and a GND power supply line W12 are arranged along the cell rack as a second-level metal layer above a cell rack (cell array) (not shown in the diagram). It is to be noted that this device is equipped with, as a multi-level wiring structure, a three-level metal wiring structure that includes a first-level metal layer, a second-level metal layer formed over the first-level metal later with an intervention of a first interlayer insulating film therebetween, and a third-level metal layer formed over the second-level metal later with an intervention of a second interlayer insulating film therebetween. As the third-level metal layer above the second-level metal layer, a pair of power supply lines formed of a GND power supply line W13 and a VDD power supply line W14 are arranged. Here, the GND power supply line W13 is arranged above the VDD power supply line W11, and the VDD power supply line W14 is arranged above the GND power supply line W12.

FIG. 7B is an enlarged layout diagram of a region including a portion enclosed by a solid line in FIG. 7A. FIG. 7C is a cross-sectional diagram along a path A-A' of FIG. 7B. FIG. 7D is a cross-sectional diagram along a path B-B' of FIG. 7B. In FIG. 7A and FIG. 7B, "X" indicates contacts between the first-level metal layer and the second-level metal layer. Meanwhile, filled circles indicate contacts between the second-level metal layer and the third-level metal layer. By having regular contacts between the second-level metal layer and the third-level metal layer, the VDD power supply line W11 and the VDD power supply line W14 are connected to each other, and also the GND power supply line W12 and the GND power supply line W13 are connected to each other, wiring resistance of these power supply lines being thus reduced.

In the present exemplary embodiment, a power supply line conveying a power voltage different from a power voltage conveyed by a power supply line provided as the second-level metal layer, is provided as the third-level metal layer. Accordingly, lower resistance similar to the prototype technology is realized by laying out either of the power supply lines and connecting it to another power supply line conveying the same power voltage.

In the device shown in FIG. 7A to 7D, the VDD power supply line W11 includes a convex part projecting towards the GND power supply line W12. Meanwhile, the GND power supply line W12 includes a convex (protrusion) part projecting towards the VDD power supply line W11. At this part of the GND power supply line W12, the GND power supply line W13 is connected via a contact or a via. In the same way, as shown in FIG. 7D, the VDD power supply line W11 and the VDD power supply line W14 are connected via a contact (via) and a convex (protrusion) part provided in the VDD power supply line W11. It is to be noted that FIGS. 7A to 7D show a case where the VDD power supply line W11 and the GND power supply line W12 provided as the second-level metal layer have concave and convex shapes, but alternatively the GND power supply line W13 and the VDD power supply line W14 provided as the third-level metal layer may have concave and convex shapes. Furthermore, concave and convex shapes may be provided also to power supply lines provided as the second-level metal layer and power supply lines provided as the third-level metal layer.

Figure 8B:
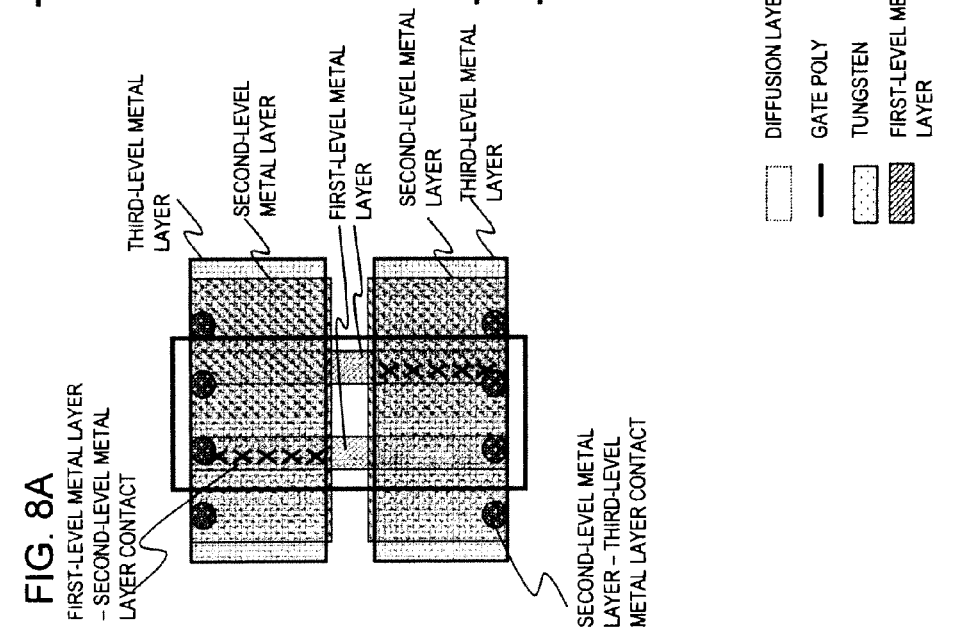
FIGS. 8A and 8B are diagrams illustrating an example of a layout of a circuit (cell) arranged below a power supply main line shown in FIGS. 7A to 7D.
Figure 8A:
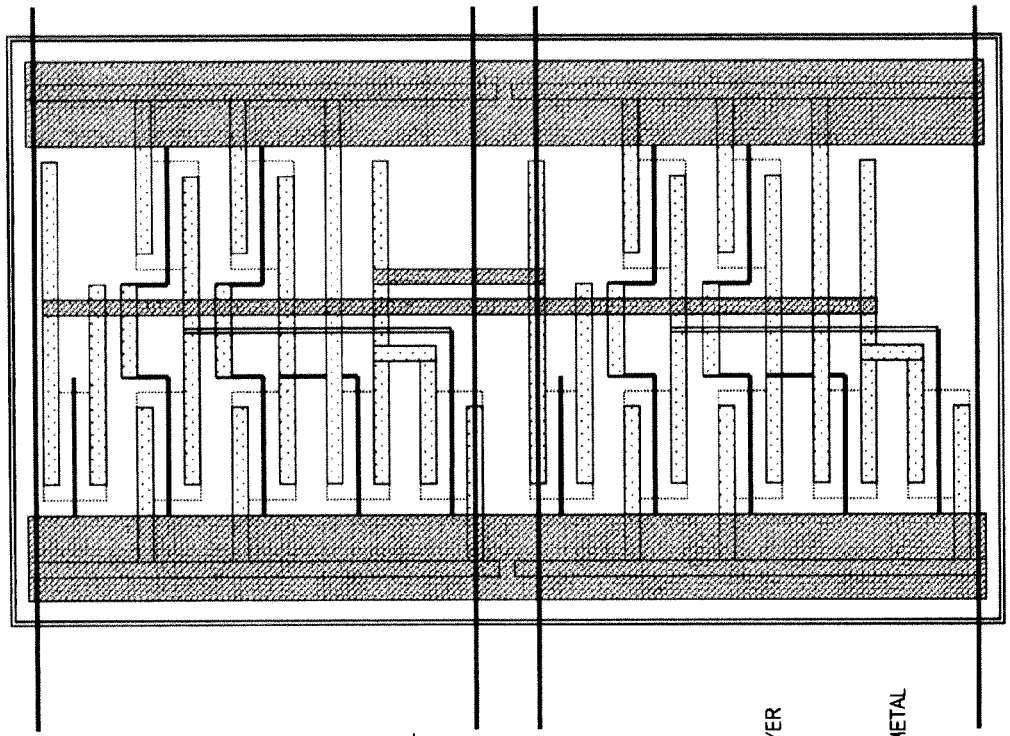

Turning to FIGS. 8A and 8B, there are shown an example of a layout of a circuit (constituted by a plurality of gate cells)

arranged below a power supply main line M101 shown in FIGS. 7A to 7D. In particular, FIG. 8B is an enlarged layout diagram of a region enclosed by a solid line in FIG. 8A. It will be therefrom seen that a plurality of MOS transistors are formed in a semiconductor substrate to constitute a gate cell, which includes diffusion layers of the transistors, poly-silicon gate electrodes/lines of transistors, a tungsten interconnection layer formed as another-level metal layer that is the lowest-level metal layer. Thus, the device shown in FIGS. 7 and 8 is formed with a four-level metal wiring structure.

In the present exemplary embodiment, the power supply line provided as the third-level metal layer and the power supply line provided as the second-level metal layer are laid out in parallel. In addition, the power supply lines provided as the second-level metal layer directly below the power supply line provided as the third-level metal layer have different power voltages. Furthermore, by configuring the power supply line provided as the second-level metal layer (or the power supply line provided as the third-level metal layer) with concave and convex shapes, the power supply line provided as the second-level metal layer and the power supply line provided as the third-level metal layer, having the same power voltage, are connected regularly.

Figure 9:
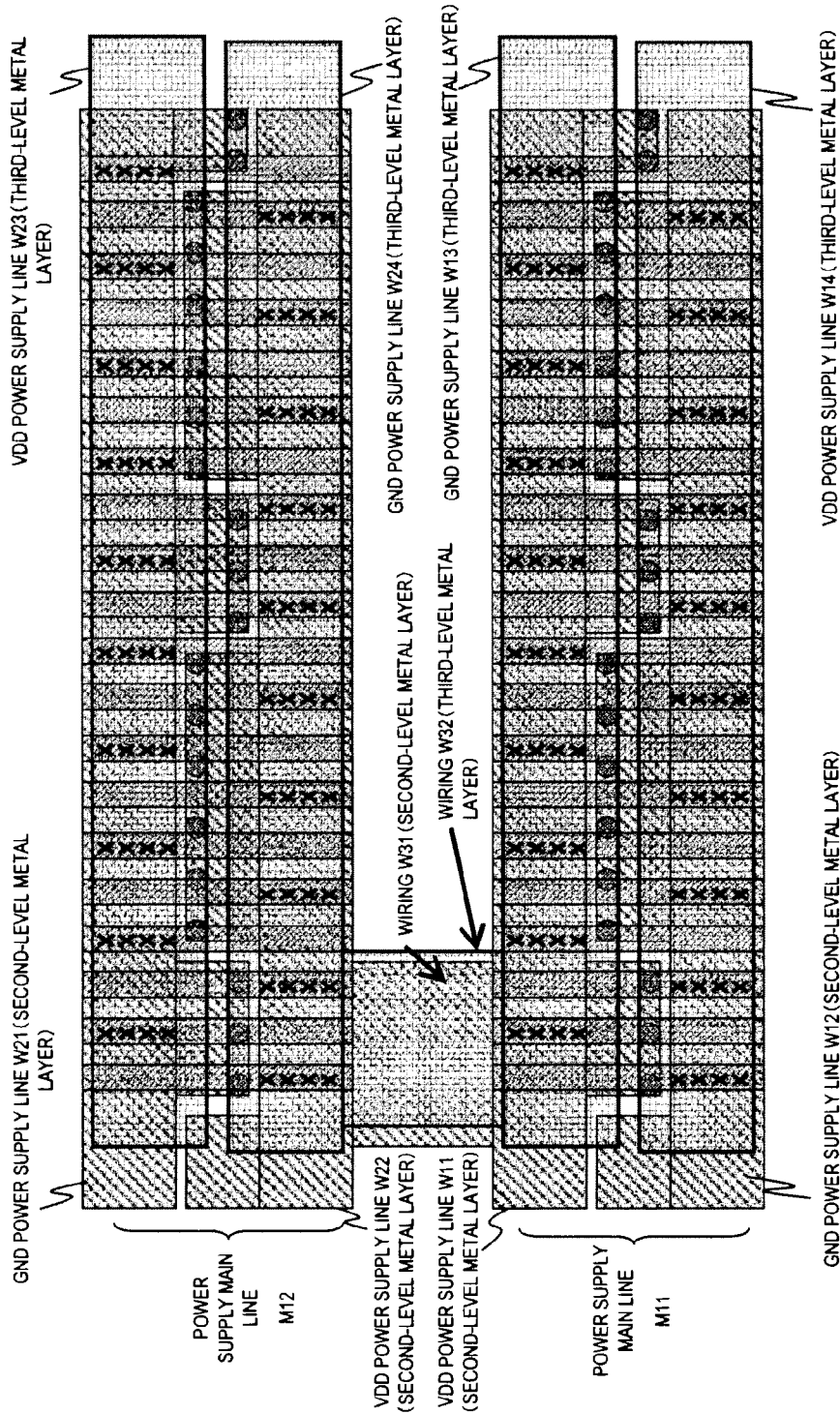
FIG. 9 is a layout diagram illustrating a configuration of a semiconductor device according to an exemplary embodiment.

Referring now to FIG. 9, a device shown therein includes two power supply main lines M11 and M12 for two gate cell racks (or line-arrangements), each rack (or line-arrangement) including a plurality of gate cells arrange in line the horizontal direction. Each of these main power line structures M11 and M12 is formed similarly to FIGS. 7A to 7D, and M11 and M12 are connected to each other.

Specifically, the power supply main line M11 includes the VDD power supply lines W11 and W14, and the GND power supply lines W12 and W13, and has a configuration similar to FIGS. 7A to 7D. Similarly, the power supply main line M12 has the GND power supply lines W21 and W24, and the VDD power supply lines W22 and W23, and has a configuration similar to FIGS. 7A to 7D.

Figure 5:
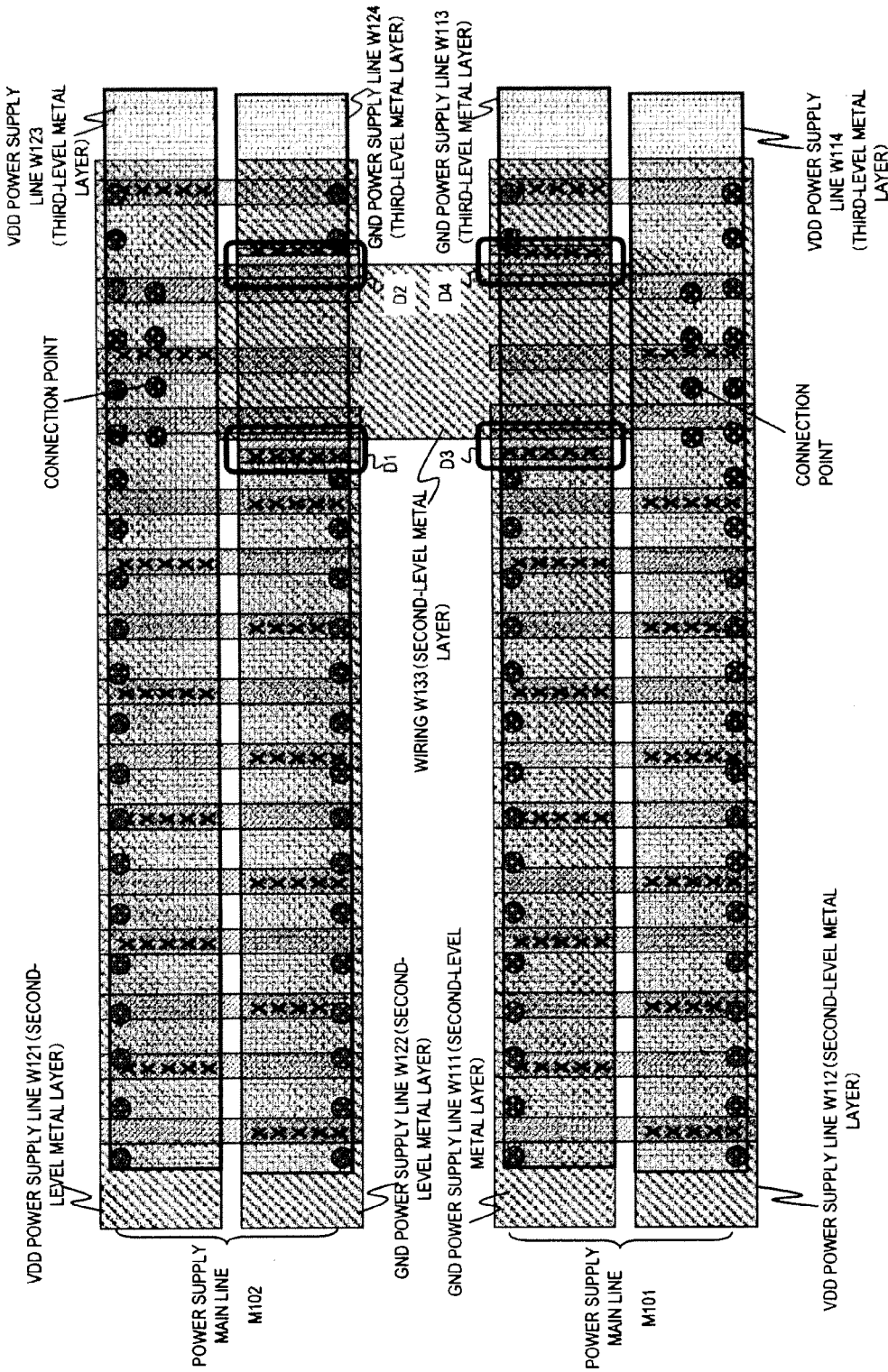

In the present exemplary embodiment, it is possible to easily interconnect power supply lines with a power voltage of either a power source voltage or a ground voltage, between the power supply main line M11 and the power supply main line M12. In other words, it is possible to easily interconnect the VDD power supply line W11 included in the power supply main line M11 and the VDD power supply line W22 included in the power supply main line M12, via wiring W31 arranged as the second-level metal layer. In the same way, it is possible to easily interconnect the GND power supply line W13 included in the power supply main line M11 and the GND power supply line W24 included in the power supply main line M12, via wiring W32 arranged as the third-level metal layer. Therefore, there is no occurrence of a region where a circuit (cell) cannot be disposed, or of a power supply line being not connected so that wiring resistance increases, as in a case of the prototype configuration described with reference to FIG. 3 or FIG. 5.

Figure 10:
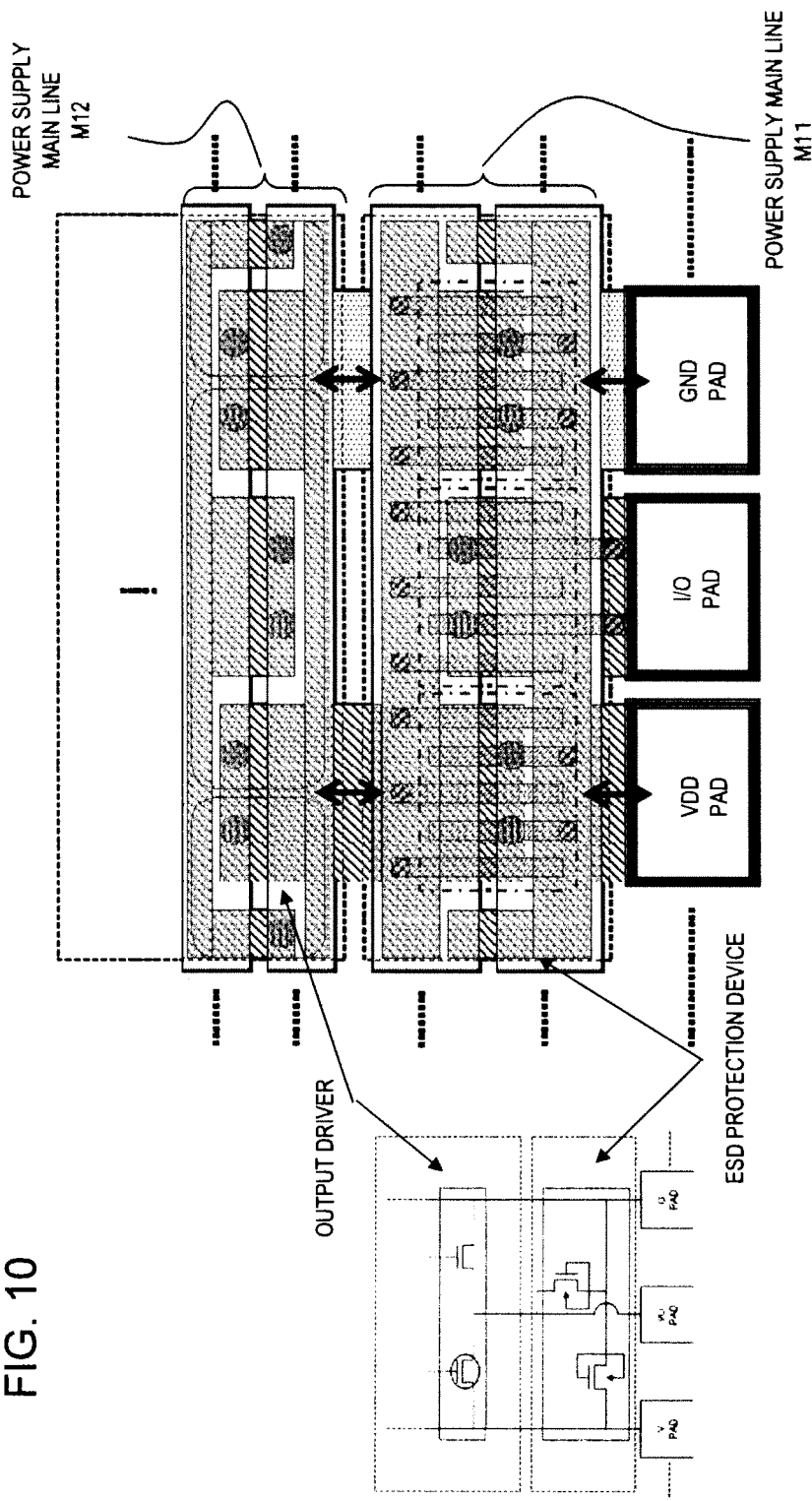
FIG. 10 is a diagram illustrating a layout in the vicinity of a PAD of the semiconductor device according to an exemplary embodiment.

Referring to FIG. 10, a layout in the vicinity of a PAD of the semiconductor device according to an embodiment is shown and includes protection devices, output transistor devices and the like which are disposed in repetitive fashion in the same form in limited regions around I/O PADs. According to this device, it is possible to connect power supply lines from PADs to the power supply main line M11, with low wiring resistance. Furthermore, connection from the power supply main line M11 to the power supply main line M12 can be easily realized with low wiring resistance. In addition, it is possible to dispose an ESD protection device below the power supply main line M11, and to dispose an internal logic circuit such as an output driver or the like under the power supply main line M12. In this way, in accordance with the present exemplary embodiment, it is possible to prevent the occurrence of a region where it is not possible to dispose a circuit (cell), by connecting between the power supply main lines.

Figure 11:
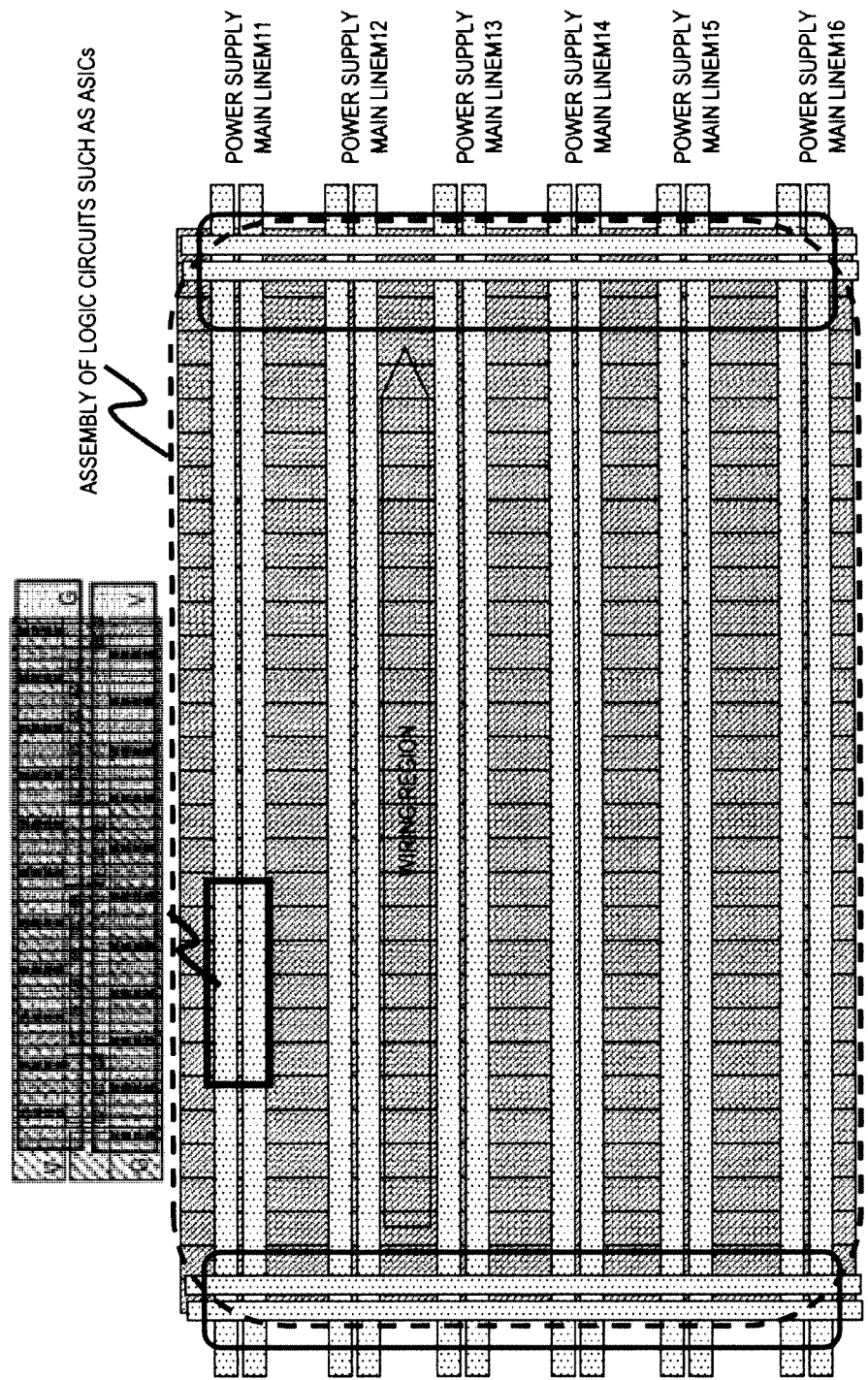
FIG. 11 is a layout diagram showing a modified exemplary embodiment.

FIG. 11 shows an example of another layout (ASIC circuit) of the semiconductor device of an embodiment. In a layout where a logic circuit is repeated as in an ASIC, it is possible to easily connect a plurality of power supply main lines M11 to M16 with circuits (cells) disposed below the power supply main lines, and it is possible to realize low resistance in an entire chip.

Figure 12A:
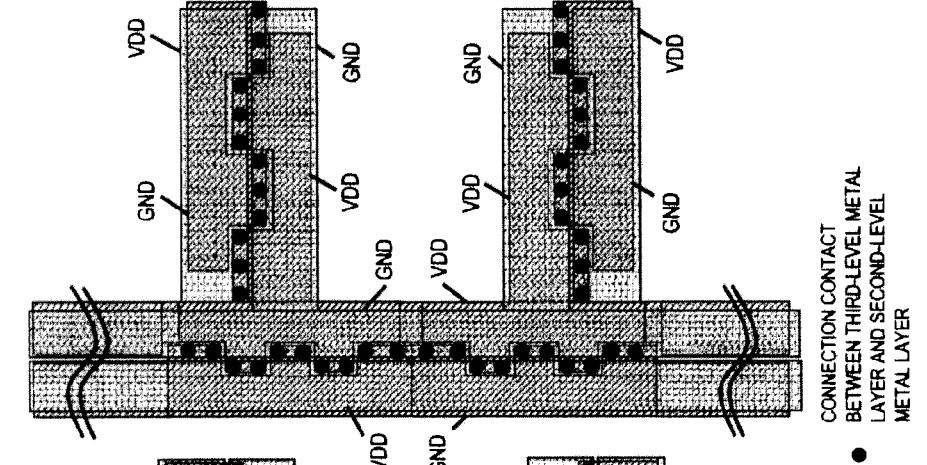
FIGS. 12A to 12C are diagrams showing an example of a method of connecting between power supply main lines in an exemplary embodiment.
Figure 12B:
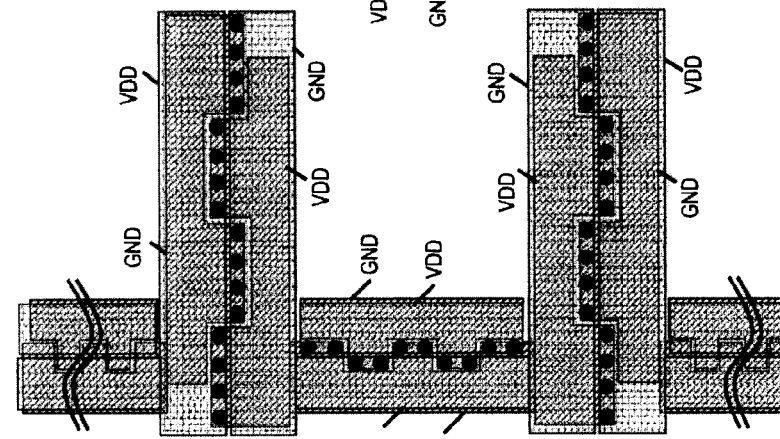
Figure 12C:
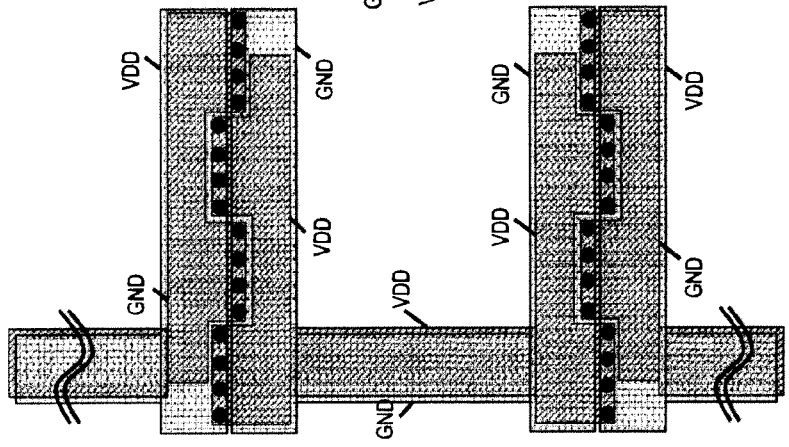

FIGS. 12A to 12C are diagrams showing an example of a method of interconnecting the power supply main lines M11 to M16 of FIG. 11. Referring to FIG. 12A, power supply lines conveying power source voltage (VDD) are connected between adjacent power supply main lines, via wiring provided as the second-level metal layer. Meanwhile, power supply lines conveying ground voltage (GND) are connected via wiring provided as the third-level metal layer. In FIG. 12B and FIG. 12C, a configuration similar to the power supply line configuration shown in FIGS. 7A to 7D is applied also to wiring connecting between adjacent power supply main lines. As shown in FIG. 12A to 12C, according to the present exemplary embodiment, it is possible to interconnect the power supply main lines with low wiring resistance.

Figure 13:
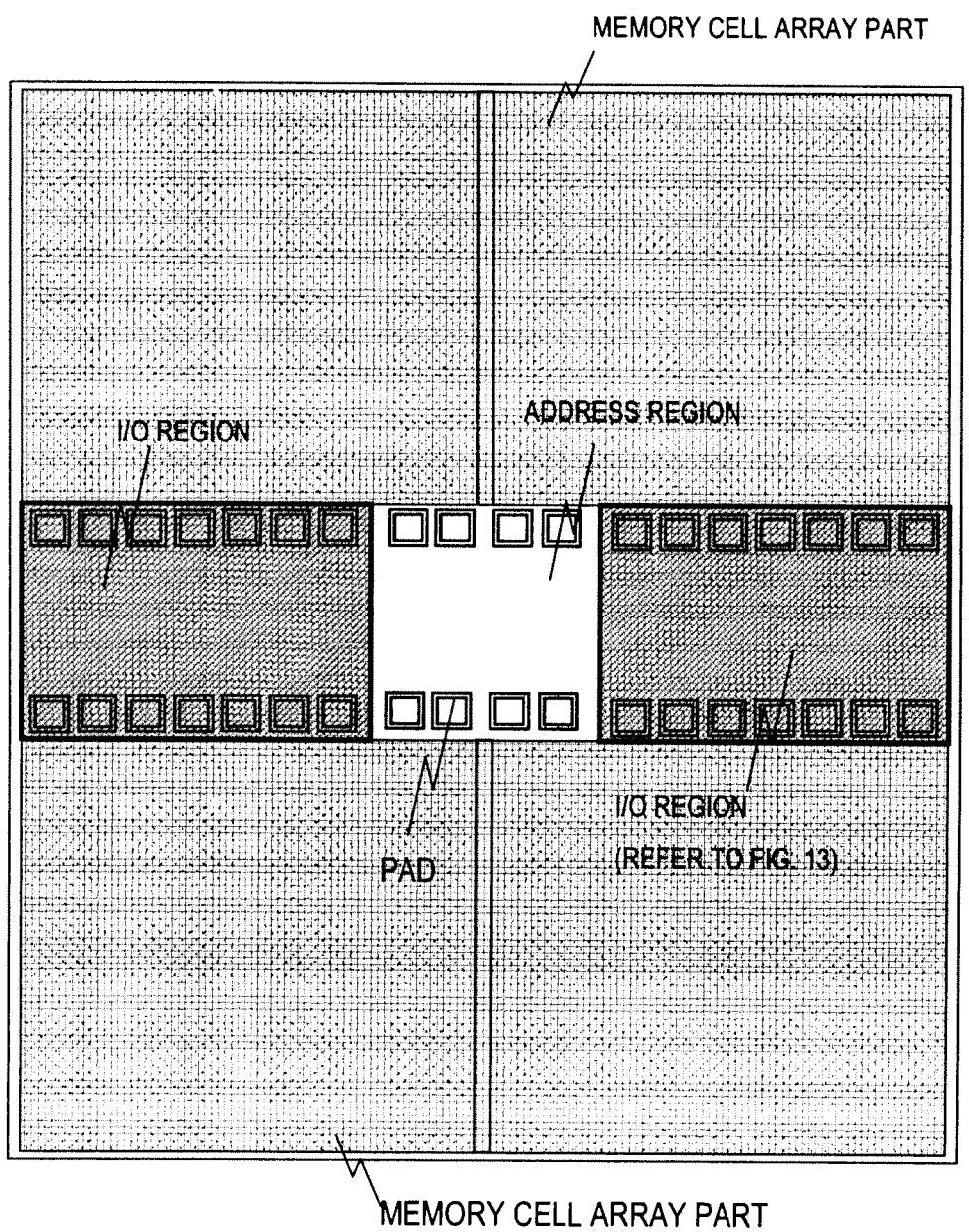
FIG. 13 is a plan view illustrating a configuration of a semiconductor device according to an exemplary embodiment.

FIG. 13 is a diagram schematically showing an overall configuration of a semiconductor chip. In a layout with a repeated configuration in a limited region, as in an I/O region, an increase in size of layout per I/O leads to an increase in chip size and causes an increase in cost. A detailed description is given later concerning this point, making reference to FIG. 14 and FIG. 15.

Furthermore, the I/O region is a region in which a plurality of I/Os are disposed; a current flowing in accordance with an output pattern condition varies, and the influence of noise problems or characteristics such as rising and falling of power supply is large. Furthermore, characteristic problems frequently occur due to the influence of board conditions when a customer chip is mounted. A detailed description is given later concerning this point, making reference to FIGS. 16A and 16B.

At present, the number of I/Os in mainstream semiconductor products is 16, 32, or the like. However, from now on, wide I/O products with 128 I/Os, 256 I/Os, and the like are expected to appear, and there is a trend for the number of I/Os to increase. Therefore, it has become more and more important to realize reduction in chip size and improvement in characteristics.

Figure 4:
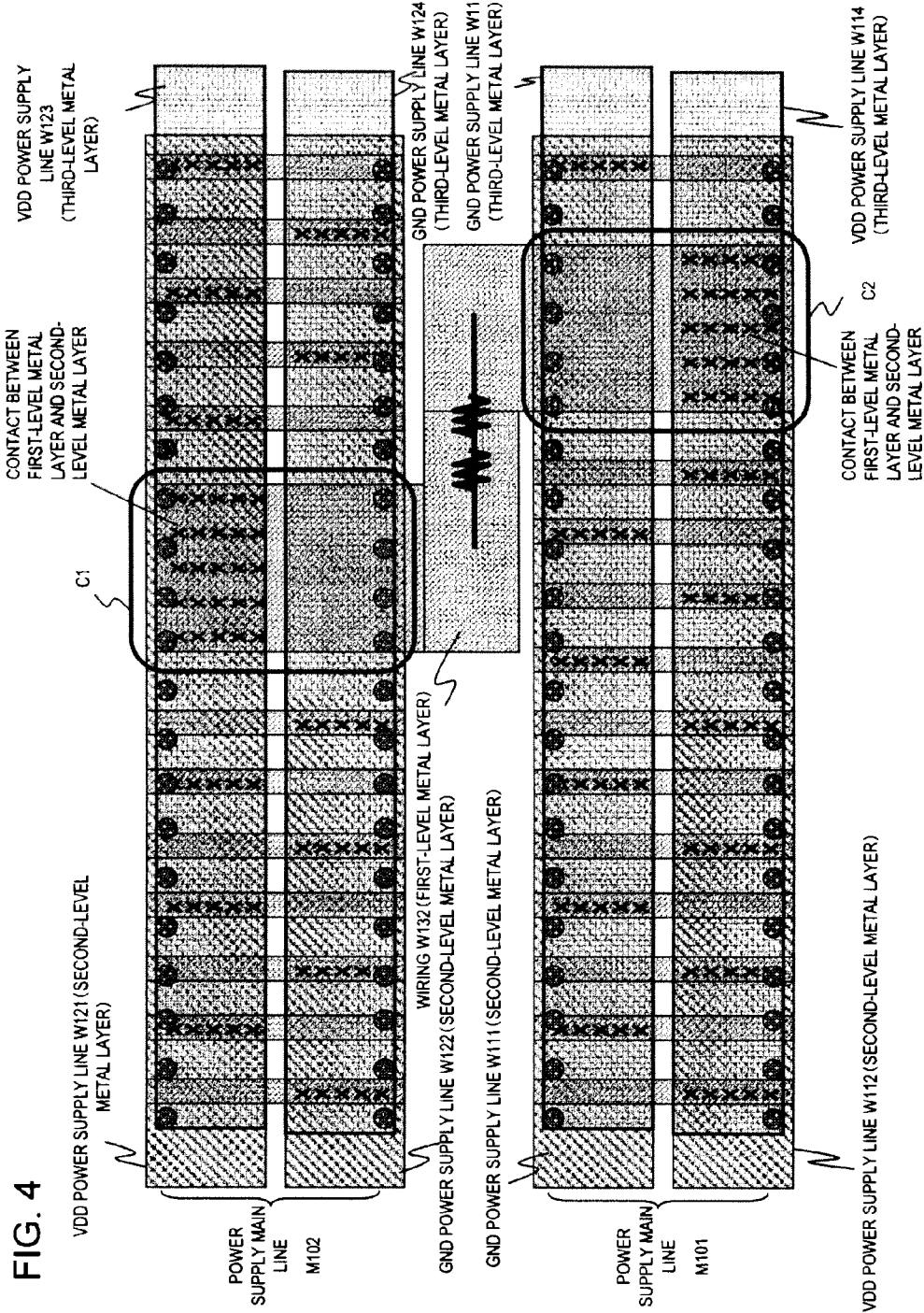
Figure 14:
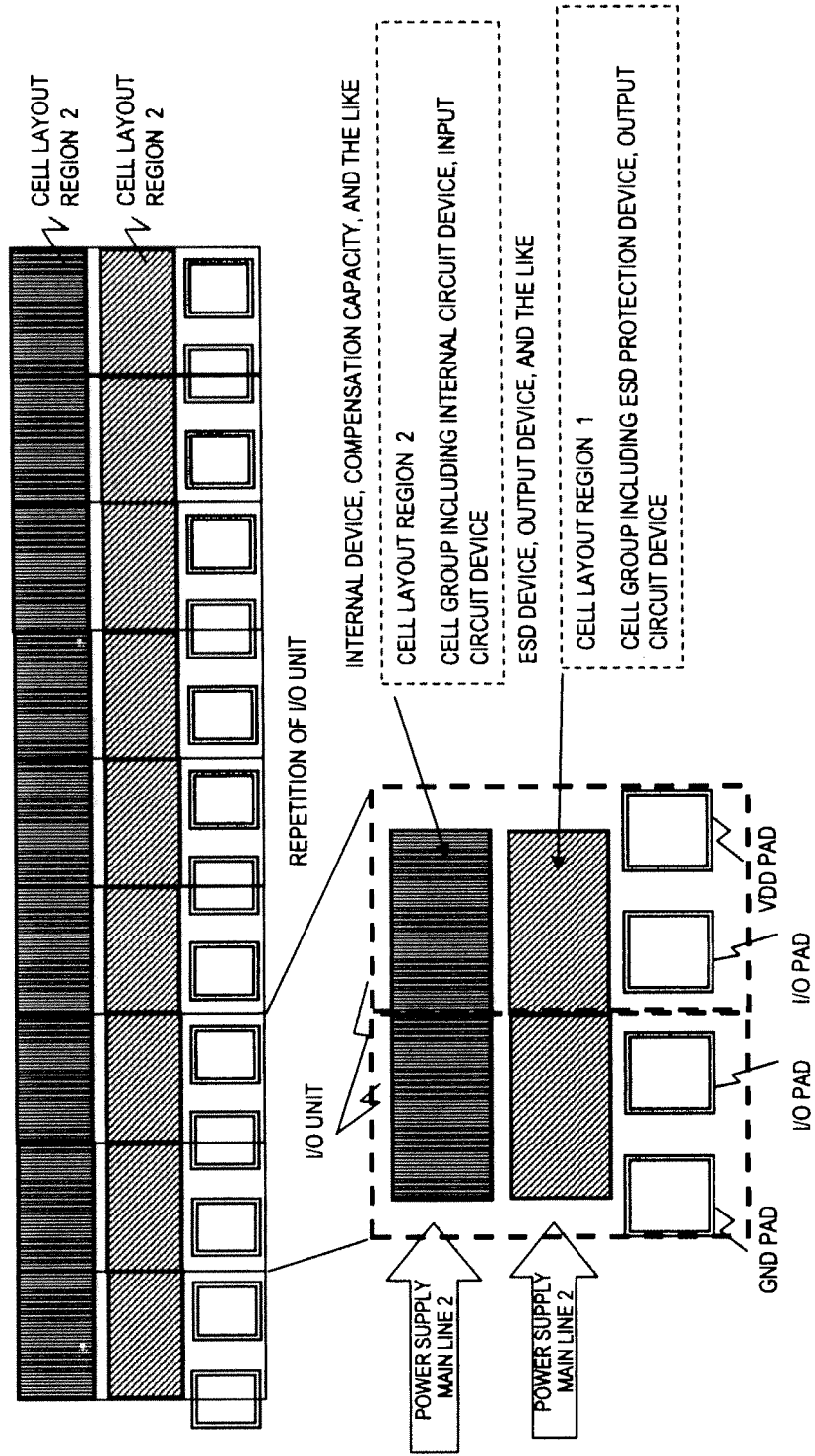
FIG. 14 is a diagram indicative of a part of the device shown in FIG. 13.

FIG. 14 is a diagram for describing an effect provided by the semiconductor device of the present exemplary embodiment. Referring to FIG. 14, protection devices, output transistor devices and the like are disposed in repetitive fashion in the same form in limited regions, around I/O PADs. According to the prototype power supply configuration, as shown in FIG. 3 and FIG. 4, when connecting between power supply main lines, there are places where circuit arrangement is not possible, and regions around the I/O PADs become large, leading to increases in chip size. On the other hand, as shown in FIG. 7A to FIG. 10, according to a power supply configuration of the present exemplary embodiment, it is possible to dispose circuits such as a protection device or the like, in all regions under the power supply main lines. Therefore, according to the present exemplary embodiment, it is possible to prevent increases in chip size without an enlargement of the regions around the I/O PADs, and this leads to a reduction in cost.

Figure 15:
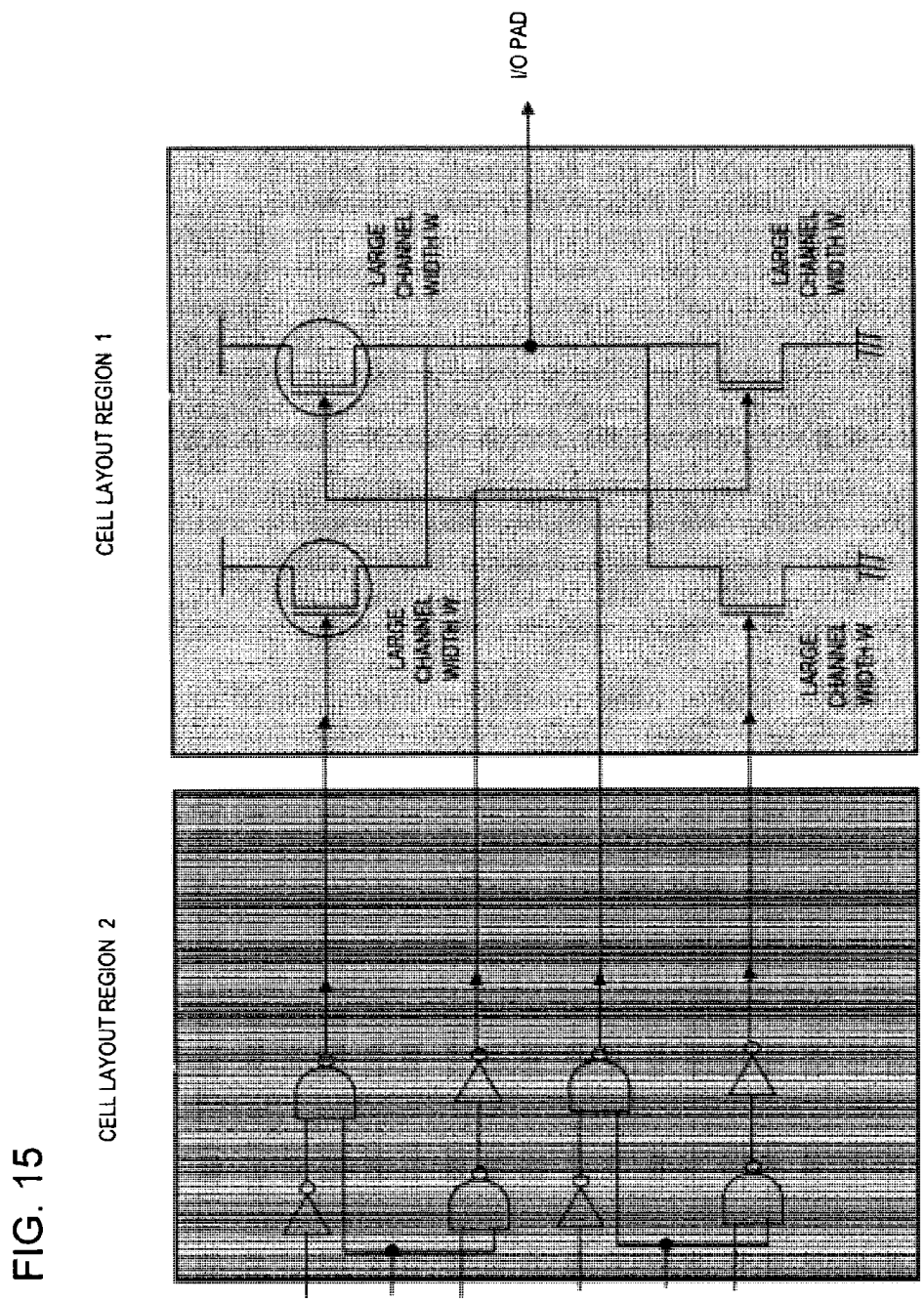
FIG. 15 is a circuit diagram constituted by cells formed in the device in FIG. 13.

FIG. 15 is a diagram showing an example of an equivalent circuit disposed in a cell layout region 1 and a cell layout region 2 of FIG. 14.

Figure 16A:
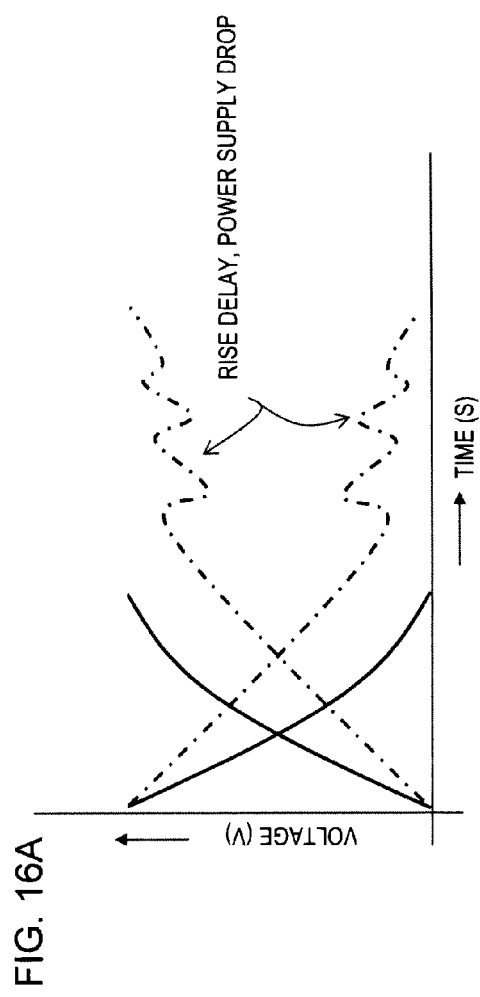
FIGS. 16A and 16B are graphs indicative of changes of power supply voltages according to the prototype device and each embodiments, respectively, in the device shown in FIG. 13.
Figure 16B:

FIGS. 16A and 16B are diagrams for describing an effect provided by the semiconductor device of the present exemplary embodiment. FIG. 16A shows rise and fall of the power source voltage VDD and the ground voltage GND in a case where the prototype configuration is used. On the other hand, FIG. 16B shows rise and fall of the power source voltage VDD and the ground voltage GND in the present exemplary embodiment. In FIGS. 16A and 16B, solid lines indicate rise and fall of the power source voltage VDD and the ground voltage GND for 1 I/O operation. On the other hand, dashed lines indicate rise and fall of the power source voltage VDD and the ground voltage GND for all I/O operations.

Referring to FIG. 16A, according to the prototype configuration, with regard to the rise and fall of the power source voltage VDD and the ground voltage GND for all I/O operations, in comparison to a single I/O operation, due to high impedance due to circuit groups shown in FIG. 14 and FIG. 15 operating at the same time, rise wave forms lose shape, and a delay occurs in power supply drop and rise (and fall) time. In addition, due to the power supply being connected with high resistance, power supply drops occur and delays in data speed or malfunctions are caused, leading to deterioration in characteristics. Thus, consideration can be given to prevention of power supply drop by providing compensation capacity in power supply lines or increasing power supply main line width, but there is a problem in that this leads to an increase in chip size.

On the other hand, according to the present exemplary embodiment, as shown in FIG. 16B, by having power supply lines conveying different power voltages in parallel, it is possible to arrange such that a delay in power supply rise and fall does not occur with respect to all I/O operations. Furthermore, as in the present exemplary embodiment, by having power supply lines conveying different power voltages in parallel, as shown in FIG. 9, it is possible to connect power supply main lines with low resistance, and it is possible to reduce the power supply resistance of the entire chip. Thus, not only improvement in characteristics are realized, but it is also possible to lower costs by reduction in chip size.

The disclosure of the above Patent Document is incorporated herein by reference thereto. Modifications and adjustments of the exemplary embodiment are possible within the scope of the overall disclosure (including the claims) of the present disclosure and based on the basic technical concept of the present disclosure. Various combinations and selections of various disclosed elements (including each element of each claim, each element of each exemplary embodiment, each element of each drawing, etc.) are possible within the scope of the claims of the present disclosure. That is, the present disclosure of course includes various variations and modifications that could be made by those skilled in the art according to the overall disclosure including the claims and the technical concept.

What is claimed is:

1. A semiconductor device comprising:
   a multi-level wiring structure including a lower-level wiring layer and an upper-level wiring layer over the lower-level wiring layer;
   a first power supply line and a second power supply line provided as the first-level wiring layer and extending in a first direction in substantially parallel to each other;
   a third power supply line provided as the upper-level wiring layer and extending in the first direction with overlapping the first power supply line, the first and third power supply lines conveying first and second power voltages, respectively, which are different from each other; and
   a fourth power supply line provided as the upper-level wiring layer and extending in the first direction with overlapping the second power supply line, the second and fourth power supply lines conveying the second and first power voltages, respectively.

2. The device according to claim 1, wherein:
   the first power voltage is a ground voltage, and the second power voltage is a power source voltage greater than the ground voltage.

3. The device according to claim 1, further comprising:
   a first contact connecting the first power supply line and the fourth power supply line; and
   a second contact connecting the second power supply line and the third power supply line.

4. The device according to claim 3, wherein
   the first power supply line comprises a convex part projecting towards the second power supply line and connected to the fourth power supply line via the first contact.

5. The device according to claim 3, wherein
   the second power supply line comprises a convex part projecting towards the first power supply line and connected to the third power supply line via the second contact.

6. The device according to claim 3, wherein
   the third power supply line comprises a convex part projecting towards the fourth power supply line and connected to the second power supply line via the second contact.

7. The device according to claim 3, wherein
   the fourth power supply line comprises a convex part projecting towards the third power supply line and connected to the first power supply line via the first contact.

8. A semiconductor device comprising:
   a first-level wiring layer, a second-level wiring layer formed over the first-level wiring layer with an intervention of a first interlayer insulating film therebetween, and a third-level wiring layer formed over the second-level wiring layer with an intervention of a second interlayer insulating film therebetween;
   a cell formation region elongated in a first direction and including a plurality of gate cells, each of the gate cells including first and second power lines each formed as the first-level wiring layer and arranged a second direction crossing the first direction;
   a third power line formed as the second-level wiring layer and elongated in the first direction to cross each of the first and second power lines of each of the gates cells;
   a plurality of first contacts each formed in the first interlayer insulating film to connect the first power line of each of the gate cells to the third power line;
   a fourth power line formed as the second-level wiring layer and elongated in the first direction to cross each of the first and second power lines of each of the gates cells;
   a plurality of second contacts each formed in the first interlayer insulating film to connect the second power line of each of the gate cells to the fourth power line;
   a fifth power line formed as the third-level wiring layer and elongated in the first direction with overlapping the third power line;
   a sixth power line formed as the third-level wiring layer and elongated in the first direction with overlapping the fourth power line;

a plurality of third contacts each formed in the second interlayer insulating film to connect the fourth and fifth power lines to each other; and a plurality of fourth contacts each formed in the second interlayer insulating film to connect the third and fourth power lines to each other.

9. The device according to claim 8, wherein the fifth power line receives a first power voltage and the sixth power line receives a second power voltage, the first power voltage being conveyed from the fifth power line to each of the gate cells through the third contacts, the fourth power line, the second contacts and the second power lines, and the second power voltage being conveyed from the sixth power line to each of the gate cells through the fourth contacts, the third power line, first contacts and the first power lines.

10. The device according to claim 9, wherein one of the third and sixth power lines includes at least one first protrusion portion projecting from a part of the one of the third and sixth power lines, and one of the fourth and fifth power lines includes at least one second protrusion portion projecting from a part of the one of the fourth and fifth power lines, the first protrusion portion overlapping a part of the other of the third and sixth power lines, the third contacts intervening between the first protrusion portion and the part of the other of the third and sixth power lines, the second protrusion portion overlapping a part of the other of the fourth and fifth power lines, and the fourth contacts intervening between the second protrusion portion and the part of the other of the fourth and fifth power lines.

11. The device as claimed in claim 9, wherein one of the third and sixth power lines includes a plurality of first protrusion portions each projecting from an associated one of a plurality of parts of the one of the third and sixth power lines, and one of the fourth and fifth power lines includes a plurality of second protrusion portions each projecting from an associated one of a plurality of parts of the one of the fourth and fifth power lines, each of the first protrusion portions overlapping a corresponding one a plurality of parts of the other of the third and sixth power lines, the third contacts intervening between the first protrusion portions and the parts of the other of the third and sixth power lines, respectively, each of the second protrusion portions overlapping a corresponding one of a plurality of parts of the other of the fourth and fifth power lines, and the fourth contacts intervening between the second protrusion portions and the parts of the other of the fourth and fifth power lines, respectively.

12. The device according to claim 11, wherein at least two of the third contacts intervenes between each of the first protrusion portions and an associated one of the parts of the other of the third and sixth power lines, and at least two of the fourth contacts intervenes between each of the second protrusion portions and an associated one of the parts of the other of the fourth and fifth power lines.

13. The device according to claim 8, wherein each of the gate cells comprises a plurality of diffusion layers, a plurality of gate electrodes and a plurality of wiring lines to constitute a gate circuit.

14. The device according to claim 13, wherein the multi-level wiring structure further includes a lower-level wiring layer, the first-level wiring layer being formed over the lower-level wiring layer with an intervention of a lower interlayer insulating film therebetween, and the each of the wiring lines is formed as the lower-level wiring layer.

15. A semiconductor device comprising:

a multi-level wiring structure comprising a lower-level wiring layer, an interlayer insulating film covering the lower-level wiring layer and an upper-level wiring layer formed over the interlayer insulating film;

a first power line formed as the lower-level wiring layer and elongated in a first direction;

a second power line formed as the lower-level wiring layer and elongated in the first direction;

a third power line formed as the lower-level wiring layer and elongated in the first direction, the second power line being sandwiched between the first and third power lines;

a fourth power line formed as the lower-level wiring layer and elongated in the first direction, the third power line being sandwiched between the second and fourth power lines;

a first connection line formed as the lower-level wiring layer to connect the second and third power lines to each other;

a fifth power line formed as the upper-level wiring layer and elongated in the first direction with overlapping the first power line, the fifth power line being electrically connected to the second power line;

a sixth power line formed as the upper-level wiring layer and elongated in the first direction with overlapping the second power line, the sixth power line being electrically connected to the first power line;

a seventh power line formed as the upper-level wiring layer and elongated in the first direction with overlapping the third power line, the seventh power line being electrically connected to the fourth power line;

an eighth power line formed as the upper-level wiring layer and elongated in the first direction with overlapping the fourth power line, the eighth power line being electrically connected to the third power line; and a second connection line formed as the upper-level wiring layer to connect sixth and seventh power lines to each other.

16. The device according to claim 15, further comprising a first power supply pad supplied with a first power voltage and a second power supply pad supplied with a second power voltage, the first power supply pad being connected to at least one of the first, fourth, sixth and seventh power lines so that each of the first, fourth, sixth and seventh power lines conveys the first power voltage, and the second power supply pad being connected to at least one of the second, third, fifth and eighth power lines so that each of the second, third, fifth and eighth power lines conveys the second power voltage.

17. The device according to claim 15, further comprising at least one first contact formed in the interlayer insulating film to connect the first and sixth power lines to each other, at least one second contact formed in the interlayer insulating film to connect the second and fifth power lines to each other, at least one third contact formed in the interlayer insulating film to connect the third and eighth power lines to each other, and at least one fourth contact formed in the interlayer insulating film to connect the fourth and seventh power lines to each other.

18. The device according to claim 15, further comprising a first cell formation region and a second cell formation region, the first cell formation region extending in the first direction under the first and second power lines and including a plurality of first cells, and the second cell formation region extending in the first direction under the third and fourth power lines and including a plurality of second cells, each of the first and second cells including an interconnection line, the interconnection line being formed as an additional lower-level wiring layer of the multi-level wiring structure, the additional lower-level wiring layer being formed under the lower-level wiring layer with an intervention of an additional interlayer insulating film therebetween.

19. The device according to claim 16, further comprising a first cell formation region and a second cell formation region, the first cell formation region extending in the first direction under the first and second power lines and including a plurality of first cells, each of the first cells receiving the first and second power voltages from the first and second power lines, respectively, the second cell formation region extending in the first direction under the third and fourth power lines and including a plurality of second cells, each of the second cells receiving the first and second power voltages from the fourth and third power lines, respectively.

* * * * *